(12) United States Patent
Sendoda et al.

(10) Patent No.: US 10,801,967 B2
(45) Date of Patent: Oct. 13, 2020

(54) MASK INSPECTION APPARATUS, SWITCHING METHOD, AND MASK INSPECTION METHOD

(71) Applicant: Lasertec Corporation, Yokohama (JP)

(72) Inventors: Tetsuya Sendoda, Yokohama (JP); Kiwamu Takehisa, Yokohama (JP); Takayuki Ishida, Yokohama (JP)

(73) Assignee: LASERTEC CORPORATION, Yokohama (JP)

( * ) Notice: Subject to any disclaimer, the term of this patent is extended or adjusted under 35 U.S.C. 154(b) by 0 days.

(21) Appl. No.: 16/709,630

(22) Filed: Dec. 10, 2019

(65) Prior Publication Data

US 2020/0182803 A1 Jun. 11, 2020

(30) Foreign Application Priority Data

Dec. 11, 2018 (JP) .................................. 2018-231404

(51) Int. Cl.
*G01N 21/88* (2006.01)
*G01N 21/956* (2006.01)
*G01N 21/21* (2006.01)

(52) U.S. Cl.
CPC ......... *G01N 21/8806* (2013.01); *G01N 21/21* (2013.01); *G01N 21/956* (2013.01); *G01N 2021/8848* (2013.01); *G01N 2021/95676* (2013.01)

(58) Field of Classification Search
CPC ............... G01N 21/8806; G01N 21/21; G01N 21/9505; G01N 21/88

USPC ....................................................... 356/237.2
See application file for complete search history.

(56) References Cited

U.S. PATENT DOCUMENTS

| 2006/0092426 | A1* | 5/2006 | Kamei ...................... G03F 1/84 356/491 |
| 2009/0161943 | A1 | 6/2009 | Yamashita et al. |
| 2009/0237909 | A1 | 9/2009 | Ogawa |
| 2016/0370300 | A1 | 12/2016 | Ogawa et al. |
| 2017/0132772 | A1* | 5/2017 | Ogawa .................. G02B 27/283 |

(Continued)

FOREIGN PATENT DOCUMENTS

| JP | H04289409 A | 10/1992 |
| JP | H05109601 A | 4/1993 |
| JP | 2003344306 A | 12/2003 |

(Continued)

*Primary Examiner* — Hung Nguyen
(74) *Attorney, Agent, or Firm* — McCoy Russell LLP (57) ABSTRACT

A mask inspection apparatus according to the present disclosure includes: a field stop unit capable of switching between a field stop for an optical mask configured to emit an incident illumination light while maintaining the polarization state thereof and a field stop for an EUV mask configured to change the polarization state of a part of the incident illumination light and to cause an illumination light including an S-polarized light and a P-polarized light; a beam splitter unit capable of switching between a PBS for an optical mask and a non-polarized BS; an objective lens configured to collect an illumination light reflected in the beam splitter unit in a mask to be inspected and collect a reflected light obtained by reflecting an illumination light in the mask to be inspected; and a λ/4 plate that can be provided in an optical path of an illumination light and a reflected light.

12 Claims, 9 Drawing Sheets

(56) References Cited

U.S. PATENT DOCUMENTS

2018/0088469 A1\*   3/2018   Otani ................... G01N 21/956

FOREIGN PATENT DOCUMENTS

| | | |
|---|---|---|
| JP | 2009216648 A | 9/2009 |
| JP | 2009223095 A | 10/2009 |
| JP | 2010092984 A | 4/2010 |
| JP | 4701460 B2 | 6/2011 |
| JP | 2012127856 A | 7/2012 |
| JP | 2013024772 A | 2/2013 |
| JP | 2014048217 A | 3/2014 |
| JP | 2017009379 A | 1/2017 |
| JP | 2017090147 A | 5/2017 |

\* cited by examiner

MASK INSPECTION APPARATUS, SWITCHING METHOD, AND MASK INSPECTION METHOD

CROSS-REFERENCE TO RELATED APPLICATIONS

This present application claims priority to Japanese Application No. 2018-231404 entitled "MASK INSPECTION APPARATUS, SWITCHING METHOD, AND MASK INSPECTION METHOD", filed on Dec. 11, 2018. The entire contents of the above listed application are hereby incorporated by reference for all purposes.

BACKGROUND

The present disclosure relates to a mask inspection apparatus, a switching method, and a mask inspection method, and relates to, for example, a mask inspection apparatus, a switching method, and a mask inspection method for inspecting defects in a photomask used in a semiconductor manufacturing process.

In a mask inspection apparatus configured to inspect an Extreme Ultraviolet (EUV) mask, in order to improve sensitivity for detecting fine patterns, an inspection is performed using an illumination light including linearly polarized light beams whose directions are different from each other.

Japanese Patent No. 4701460 discloses causing an illumination light including a first linearly polarized light and a second linearly polarized light whose polarization directions are different from each other to be reflected in a half mirror, thereby illuminating a mask to be inspected.

On the other hand, in the mask inspection apparatus configured to inspect an optical mask, when the illumination light is reflected in the half mirror, it is possible that loss of light amount may be caused and thus it may be difficult to secure the amount of illumination light necessary for the inspection. In order to solve this problem, by using a beam splitter and a λ/4 plate as a reflected illumination optical system, the mask to be inspected is illuminated with an illumination light including a circularly polarized light.

Figure 1A:
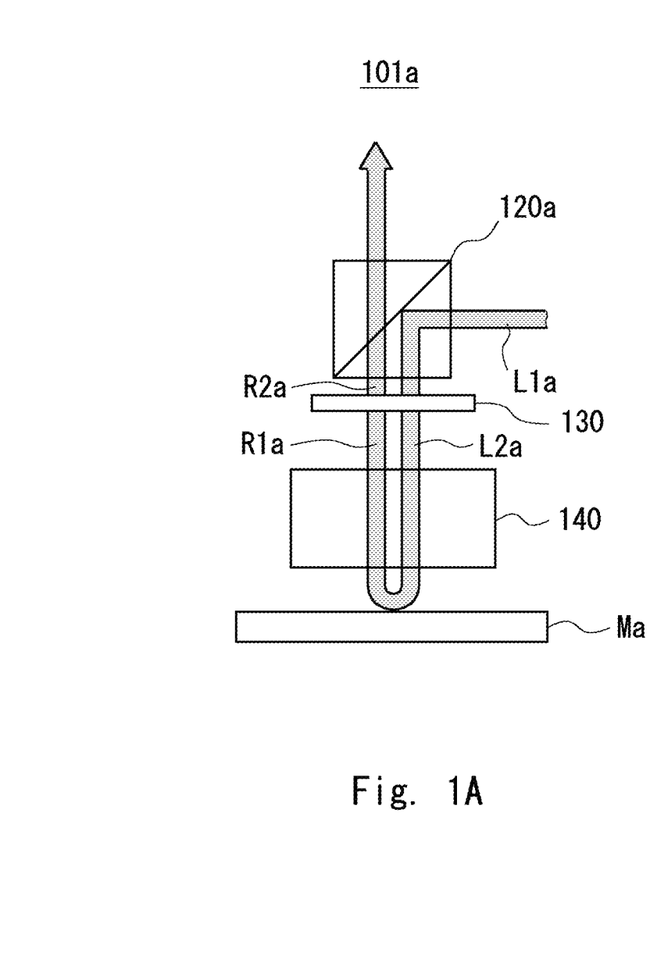
FIG. 1A is a diagram illustrating a configuration of an inspection apparatus for inspecting an optical mask.
Figure 1B:
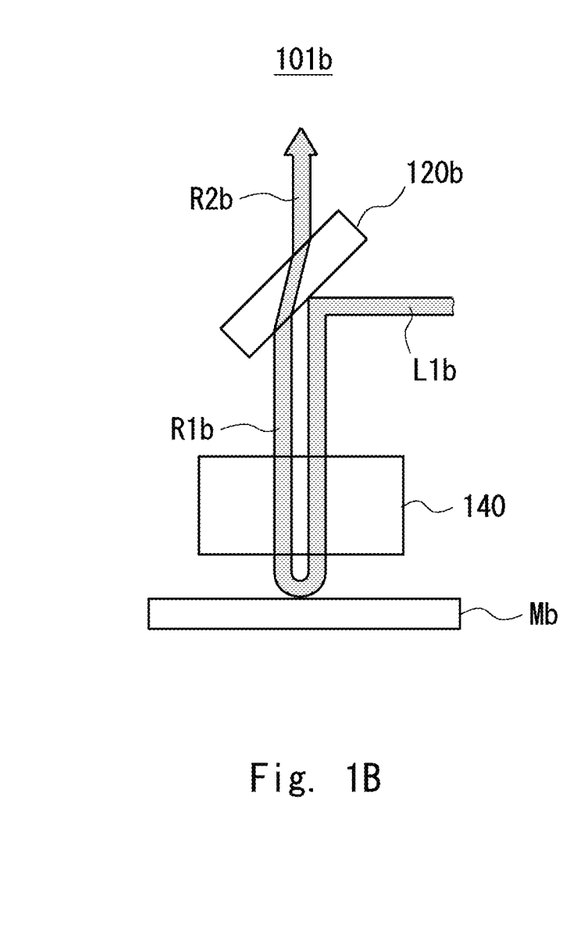
FIG. 1B is a diagram illustrating a configuration of an inspection apparatus for inspecting an EUV mask.

FIG. 1A is a diagram illustrating a configuration of an inspection apparatus for inspecting an optical mask and FIG. 1B is a diagram illustrating a configuration of an inspection apparatus for inspecting an EUV mask. As shown in FIG. 1A, in an inspection apparatus 101a for inspecting an optical mask Ma, for example, an illumination light L1a including an S-polarized light of a linearly polarized light is reflected in a beam splitter 120a. The beam splitter 120a transmits a P-polarized light while reflecting the S-polarized light. The P-polarized light is a linearly polarized light perpendicular to the S-polarized light. The illumination light L1a reflected in the beam splitter 120a is transmitted through a λ/4 plate 130, whereby the illumination light L1a is converted into an illumination light L2a including a circularly polarized light.

The illumination light L2a which has been converted to include the circularly polarized light by the λ/4 plate 130 is collected by an objective lens 140 and illuminates the optical mask Ma. A reflected light R1a obtained by reflecting the illumination light L2a in the optical mask Ma is collected by the objective lens 140. The reflected light R1a reflected in the optical mask Ma includes a circularly polarized light whose rotation is opposite to that of the illumination light L2a. The reflected light R1a including the circularly polarized light collected by the objective lens 140 is transmitted through the λ/4 plate 130, whereby the reflected light R1a is converted into a reflected light R2a including a P-polarized light. Therefore, the reflected light R2a including the P-polarized light is transmitted through the beam splitter 120a and is then detected by a detector.

On the other hand, as shown in FIG. 1B, in a case of an inspection apparatus 101b for inspecting an EUV mask, an illumination light L1b including an S-polarized light and a P-polarized light is used. It is therefore possible to improve detection sensitivity of the fine patterns along the vertical direction and the horizontal direction on the pattern surface of the mask Mb. In order to cause both the S-polarized light and the P-polarized light to be reflected, the illumination light L1b is reflected in a half mirror 120b. The illumination light L1b reflected in the half mirror 120b is collected by the objective lens 140, and illuminates the EUV mask Mb. A light R1b obtained by reflecting the illumination light L1b in the EUV mask Mb is collected by the objective lens 140. The reflected light R1b collected by the objective lens 140 includes an S-polarized light and a P-polarized light. The reflected light R1b is transmitted through the half mirror 120b. A transmitted reflected light R2b is detected by a detector.

In order to inspect the optical mask Ma and the EUV mask Mb by one mask inspection apparatus, the beam splitter 120a and the half mirror 120b need to be switched and the λ/4 plate 130 needs to be provided and removed. However, due to the switching between the beam splitter 120a and the half mirror 120b, an optical axis is deviated.

For example, while the reflection of the illumination light L1a and the transmission of the reflected light R2a are controlled by a thin film such as a dielectric multilayer in the beam splitter 120a, the reflection of the illumination light L1b and the transmission of the reflected light R1b are controlled by a transparent member having a flat plate shape in the half mirror 120b. Therefore, due to refraction in the interface of the half mirror 120b, the optical axis is deviated between the reflected light R1b that is made incident on the half mirror 120b and the reflected light R2b emitted from the half mirror 120b. Further, the optical axis is deviated between the reflected light R2a emitted from the beam splitter 120a and the reflected light R2b emitted from the half mirror 120b.

Further, on the reflection surface of the half mirror 120b, reflectance may depend on the polarization direction, which greatly affects the amount of light of the reflected light R2b and reduces the accuracy of the inspection.

An object of the present disclosure is to provide a mask inspection apparatus, a switching method, and a mask inspection method capable of inspecting the optical mask Ma and the EUV mask Mb and improving the accuracy of the inspection.

SUMMARY

A mask inspection apparatus according to the present disclosure includes: a field stop unit capable of switching between a field stop for an optical mask configured to emit an incident illumination light including a first linearly polarized light while maintaining the polarization state of the illumination light and a field stop for an EUV mask configured to change the polarization state of a part of the incident illumination light including the first linearly polarized light and to cause the illumination light including the first linearly polarized light and a second linearly polarized light whose polarization direction is different from that of the first linearly polarized light to be emitted; a beam splitter unit capable of switching between a PBS for an optical mask configured to reflect light including the first linearly polarized light and transmit light including the second linearly polarized light and a non-polarized BS configured to reflect a part of light including the first linearly polarized light and the second linearly polarized light and transmit the part of light including the first linearly polarized light and the second linearly polarized light; an objective lens configured to collect the illumination light reflected in the beam splitter unit in a mask to be inspected and collect reflected light obtained by reflecting the illumination light in the mask to be inspected; a λ/4 plate that can be provided in an optical path of the illumination light and the reflected light; and a first detector configured to detect the reflected light including one of the first linearly polarized light and the second linearly polarized light that have been collected by the objective lens and have been transmitted through the beam splitter unit and a second detector configured to detect the reflected light including the other one of the first linearly polarized light and the second linearly polarized light. According to the above configuration, it is possible to inspect the optical mask and the EUV mask and to improve the accuracy of the inspection.

Further, a switching method according to the present disclosure is a switching method of the aforementioned mask inspection apparatus, in which when the optical mask is inspected, the field stop unit is switched to the field stop for the optical mask, the beam splitter unit is switched to the PBS for the optical mask, and the λ/4 plate is provided in the optical path of the illumination light and the reflected light, and when the EUV mask is inspected, the field stop unit is switched to the field stop for the EUV mask, the beam splitter unit is switched to the non-polarized BS, and the λ/4 plate is removed from the optical path of the illumination light and the reflected light. According to the above configuration, it is possible to inspect the optical mask and the EUV mask.

Further, an inspection method according to the present disclosure uses: a field stop unit capable of switching between a field stop for an optical mask configured to emit an incident illumination light including a first linearly polarized light while maintaining the polarization state of the illumination light and a field stop for an EUV mask configured to change the polarization state of a part of the incident illumination light including the first linearly polarized light and to cause the illumination light including the first linearly polarized light and a second linearly polarized light whose polarization direction is different from that of the first linearly polarized light to be emitted; and a beam splitter unit capable of switching between a PBS for an optical mask configured to reflect light including the first linearly polarized light and transmit light including the second linearly polarized light and a non-polarized BS configured to reflect a part of light including the first linearly polarized light and the second linearly polarized light and transmit the part of light including the first linearly polarized light and the second linearly polarized light, in which, when the optical mask is inspected, the method includes: a step of switching the field stop unit to the field stop for the optical mask and switching the beam splitter unit to the PBS for the optical mask; a step of reflecting the illumination light that has passed through the field stop for the optical mask in the PBS for the optical mask; a step of changing the polarization state in such a way that the illumination light reflected in the PBS for the optical mask includes a circularly polarized light; a step of collecting the illumination light including the circularly polarized light in the optical mask and collecting the reflected light obtained by reflecting the illumination light in the optical mask; a step of changing the polarization state in such a way that the reflected light includes the second linearly polarized light; and a step of detecting the reflected light including the second linearly polarized light, and when the EUV mask is inspected, the method includes: a step of switching the field stop unit to the field stop for the EUV mask and switching the beam splitter unit to the non-polarized BS; a step of reflecting the illumination light that has passed through the field stop for the EUV mask in the non-polarized BS; a step of collecting the illumination light reflected in the non-polarized BS in the EUV mask and collecting the reflected light obtained by reflecting the illumination light in the EUV mask; and a step of detecting the reflected light including the first linearly polarized light and the reflected light including the second linearly polarized light. According to the above configuration, it is possible to inspect the optical mask and the EUV mask and to improve the accuracy of the inspection.

According to the present disclosure, it is possible to provide a mask inspection apparatus, a switching method, and a mask inspection method capable of inspecting an optical mask and an EUV mask and improving the accuracy of the inspection.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

In the following, with reference to the drawings, a specific configuration of an embodiment will be explained. The description in the following is simply for preferable embodiments of the present disclosure and is not intended to limit the scope of the present disclosure to the following embodiment. In the following description, the same components denoted by the same reference symbols indicate substantially similar components.

Embodiment

Configuration of Mask Inspection Apparatus

Figure 2:
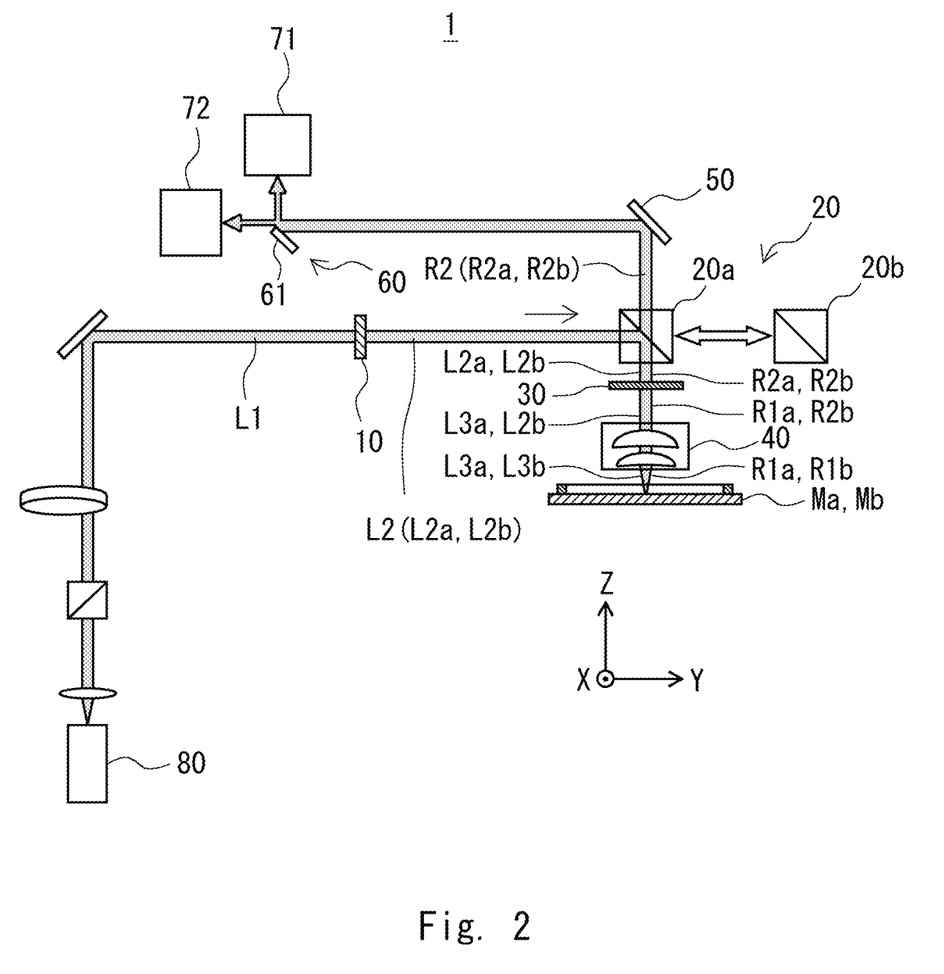
FIG. 2 is a configuration diagram illustrating a mask inspection apparatus according to an embodiment.

A mask inspection apparatus according to an embodiment will be explained. The mask inspection apparatus according to this embodiment is, for example, a mask inspection apparatus configured to detect defects in a photomask used in a semiconductor manufacturing process. The mask inspection apparatus according to this embodiment includes an optical mask Ma and an EUV mask Mb as targets to be inspected. FIG. 2 is a configuration diagram illustrating a mask inspection apparatus according to a first embodiment.

As shown in FIG. 2, a mask inspection apparatus 1 includes a field stop unit 10, a beam splitter unit 20, a λ/4 plate 30, an objective lens 40, a mirror 50, a polarization splitting unit 60, and detectors 71 and 72. Further, the mask inspection apparatus 1 may include a light source 80, and may include optical members such as a lens (not shown) and a mirror (not shown). A plurality of optical members such as the lens and the mirror that are not shown may be provided.

The mask inspection apparatus 1 inspects, for example, defects of patterns of the optical mask Ma and the EUV mask Mb, which are targets to be inspected. The EUV mask Mb is a mask that uses an EUV light as an exposure light and the optical mask Ma is a mask that uses an exposure light having a wavelength larger than that of the EUV light. For the sake of convenience of the description of the mask inspection apparatus 1, XYZ orthogonal coordinate axes are introduced. The plane parallel to the pattern surface of each of the optical mask Ma and the EUV mask Mb is referred to as an XY plane. The direction perpendicular to the pattern surface is a Z-axis direction. For example, the upper side is a +Z-axis direction and the lower side is a −Z-axis direction. Note that the XYZ orthogonal coordinate axes are used for explaining the mask inspection apparatus 1 and do not indicate the position when the mask inspection apparatus 1 is actually used.

An illumination light L1 that illuminates the mask to be inspected is, for example, a laser light. The illumination light L1 emitted from the light source 80 passes through the optical members such as the lens and the mirror, and is then incident on the field stop unit 10. The illumination light L1 that is made incident on the field stop unit 10 includes a linearly polarized light. The illumination light L1 includes, for example, a linearly polarized light of an S-polarized light. The illumination light L1 that is made incident on the field stop unit 10 may include a linearly polarized light of a P-polarized light, or may include a polarized light of another direction as long as the illumination light L1 is a linearly polarized light. Further, in the following description, the P-polarized light may be replaced by the S-polarized light and the S-polarized light may be replaced by the P-polarized light. Further, the S-polarized light may be referred to as a first linearly polarized light and the P-polarized light may be referred to as a second linearly polarized light. Alternatively, the S-polarized light may be referred to as a second linearly polarized light and the P-polarized light may be referred to as a first linearly polarized light. Further, different polarized light beams other than the S-polarized light and the P-polarized light may be referred to as a first linearly polarized light and a second linearly polarized light. The field stop unit 10 controls the polarization state of the incident illumination light L1.

Figure 3:
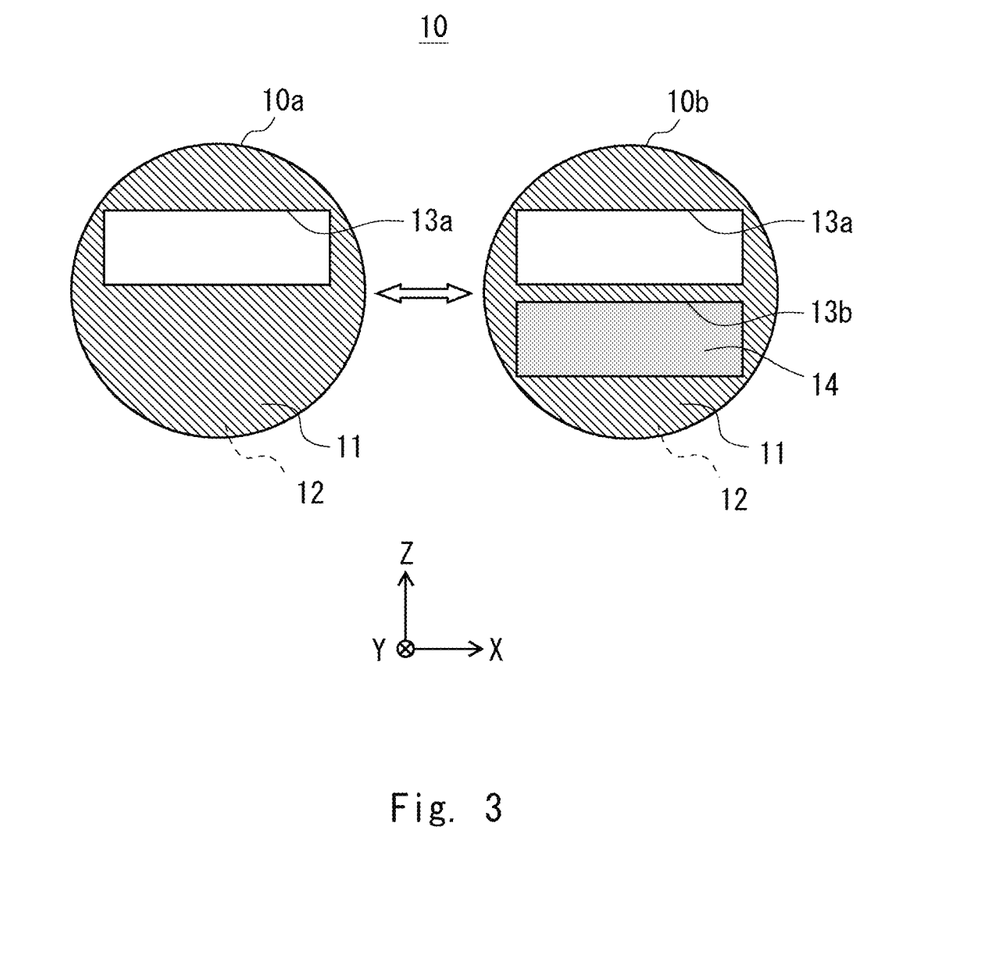
FIG. 3 is a plan view illustrating a field stop unit in the mask inspection apparatus according to the embodiment.

FIG. 3 is a plan view illustrating the field stop unit 10 in the mask inspection apparatus 1 according to the embodiment. As shown in FIG. 3, the field stop unit 10 includes a field stop for an optical mask 10a and a field stop for an EUV mask 10b. The field stop unit 10 is able to switch between the field stop for the optical mask 10a and the field stop for the EUV mask 10b in accordance with the mask to be inspected.

The field stop for the optical mask 10a is a member having a flat plate shape, and is provided with one slit 13a that penetrates from one plate surface 11 to another plate surface 12. The slit 13a has, for example, a rectangular shape when it is seen from the direction perpendicular to the plate surface 11. The slit 13a is, for example, a cavity. The field stop for the optical mask 10a causes an illumination light L2a to be emitted while maintaining the polarization state of the incident illumination light L1 including the linearly polarized light. Specifically, the illumination light L2a that has passed through the slit 13a is emitted from the field stop for the optical mask 10a while maintaining the polarization state. The part of the illumination light L2a that has been transmitted through the slit 13a is referred to as a beam. The polarization state of the beam that has passed through the slit 13a is not changed. Therefore, the illumination light L2a that has been transmitted through the field stop for the optical mask 10a includes an S-polarized beam that has been transmitted through the slit 13a.

On the other hand, the field stop for the EUV mask 10b, which is a member having a flat plate shape, includes two slits 13a and 13b that penetrate from one plate surface 11 to the other plate surface 12. One slit 13a does not cause the polarization state of the incident illumination light L1 to be changed and causes an illumination light L2b to be emitted without changing its polarization state, similar to the slit 13a of the field stop for the optical mask 10a. However, the other slit 13b is provided with a λ/2 plate 14. Therefore, the polarization state of the beam that has passed through the slit 13b is changed.

The illumination light L2b that has been transmitted through the slit 13b includes a linearly polarized light whose polarization direction is different from the polarization direction before the transmission. The beam that has been transmitted through the slit 13b includes, for example, a linearly polarized light of a P-polarized light. Therefore, the illumination light L2b that has been transmitted through the field stop for the EUV mask 10b includes the S-polarized beam that has been transmitted through the slit 13a and the P-polarized beam that has been transmitted through the slit 13b. Therefore, the field stop for the EUV mask 10b changes the polarization state of a part of the incident illumination light L1 including the S-polarized light and emits the illumination light L2b including the S-polarized light and the P-polarized light whose polarization direction is different from that of the S-polarized light. In this way, the field stop for the EUV mask 10b includes the λ/2 plate 14, and the illumination light L2b that has been emitted from the field stop for the EUV mask 10b includes a part of the light that has been transmitted through the λ/2 plate 14.

The illumination light L2 that has been transmitted through the field stop unit 10 is either the illumination light L2a including the S-polarized beam or the illumination light L2b including both the S-polarized beam and the P-polarized beam. The illumination light L2 is made incident on the beam splitter unit 20. The beam splitter unit 20 reflects at least a part of the illumination light L2. The beam splitter unit 20 can be switched between the PBS for the optical mask 20a and the non-polarized BS 20b.

The PBS for the optical mask 20a reflects the S-polarized light and transmits the P-polarized light. The PBS for the optical mask 20a reflects, for example, the illumination light L2a including the S-polarized beam that is made incident via the field stop for the optical mask 10a. For example, the PBS for the optical mask 20a reflects the illumination light L2a toward the optical mask Ma on the lower side. Further, the PBS for the optical mask 20a transmits a reflected light R2a including the P-polarized beam converted by the λ/4 plate 30 to the upper side.

Specifically, the illumination light L2a that has been made incident on the PBS for the optical mask 20a travels to the lower side, and is then converted into an illumination light L3a including circularly polarized light beams by the λ/4 plate 30. Then the illumination light L3a including the circularly polarized light beams is collected in the objective lens 40 and illuminates the optical mask Ma.

Figure 4A:
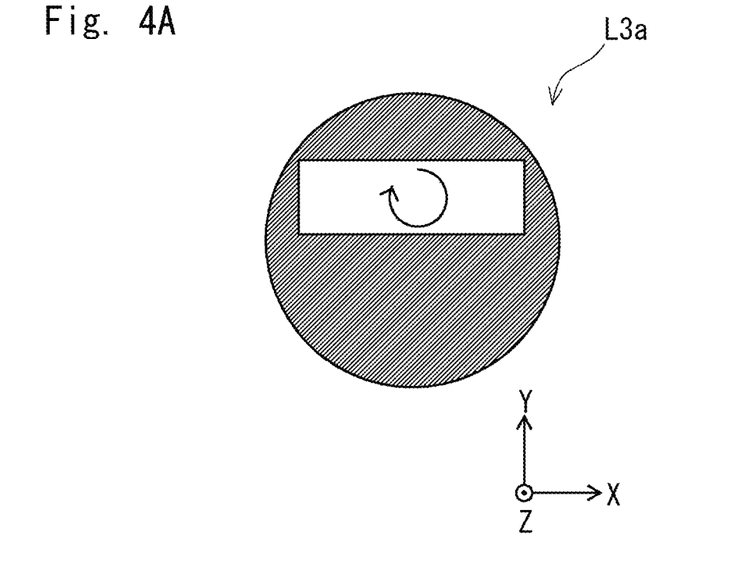
FIG. 4A is a plan view illustrating an illumination light for illuminating a pattern surface of an optical mask in the mask inspection apparatus according to the embodiment.

FIG. 4A is a plan view illustrating the illumination light L3a that illuminates the pattern surface of the optical mask Ma in the mask inspection apparatus 1 according to the embodiment. As shown in FIG. 4A, the illumination light L3a that illuminates the pattern of the optical mask Ma includes circularly polarized light beams. A lens (not shown) may be arranged in a predetermined position on the optical path of the illumination light L1 and L2, and a relay optical system may be formed of the lens and the objective lens 40. Then the field stop unit 10 may be arranged in a position conjugated with the mask to be inspected. According to this configuration, an intermediate projection image in the vicinity of the field stop unit 10 can be projected onto the pattern surface in the mask to be inspected.

As shown in FIG. 2, a reflected light R1a obtained by reflecting the illumination light L3a in the mask Ma includes circularly polarized light beams. Note that the reflected light R1a includes circularly polarized light beams whose rotation is opposite to that of the illumination light L3a. The reflected light R1a is collected in the objective lens 40 and is transmitted through the λ/4 plate 30. At this time, the reflected light R1a including the circularly polarized light beams is converted into a reflected light R2a including the P-polarized beam. The reflected light R2a is transmitted through the PBS for the optical mask 20a.

The λ/4 plate 30 converts the illumination light L2a including the S-polarized beam into the illumination light L3a including the circularly polarized light beams when it causes the illumination light L2a to be transmitted. Further, the λ/4 plate 30 converts the reflected light R1a including the circularly polarized light beams into the reflected light R2a including the P-polarized beam when it causes the reflected light R1a to be transmitted. The reflected light R1a including the circularly polarized light beams is the reflected light R1a obtained by reflecting the illumination light L3a in the optical mask Ma. The λ/4 plate 30 can be provided in the optical path of the illumination light L2a and the reflected light R1a. The λ/4 plate 30 is provided in an optical path of the illumination light L2a and the reflected light R1a in a case in which the optical mask Ma is inspected. The λ/4 plate 30 is removed from the optical path of the illumination light L2b and a reflected light R2b in a case in which the EUV mask Mb is inspected.

The non-polarized BS 20b reflects a part of the illumination light L2b including the S-polarized beam and the P-polarized beam and causes a part of the reflected light R2b including the S-polarized beam and the P-polarized beam to be transmitted. The non-polarized BS 20b includes, for example, a metal film. Therefore, the non-polarized BS 20b reflects a part of the illumination light L2b including the S-polarized beam and the P-polarized beam that are made incident via the field stop for the EUV mask 10b. The non-polarized BS 20b reflects the illumination light L2b toward the EUV mask MB on the lower side. The objective lens 40 collects the illumination light L2b reflected in the non-polarized BS 20b in the EUV mask Mb. The objective lens 40 illuminates the EUV mask Mb with a collected illumination light L3b.

Figure 4B:
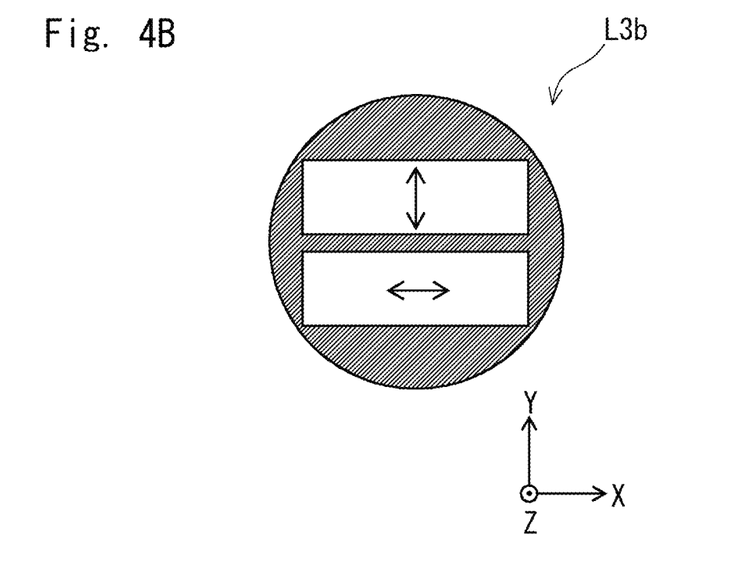
FIG. 4B is a plan view illustrating an illumination light for illuminating a pattern surface of an EUV mask in the mask inspection apparatus according to the embodiment.

FIG. 4B is a plan view illustrating the illumination light L3b that illuminates the pattern surface of the EUV mask Mb in the mask inspection apparatus 1 according to the embodiment. As shown in FIG. 4B, the illumination light L3b that illuminates the pattern of the EUV mask Mb includes an S-polarized beam and a P-polarized beam. For example, the pattern surface on the +Y-axis direction side is illuminated with the S-polarized beam and the pattern surface on the −Y-axis direction side is illuminated with the P-polarized beam.

A light R1b reflected in the EUV mask Mb includes an S-polarized beam and a P-polarized beam. The objective lens 40 collects the reflected light R1b obtained by reflecting the illumination light L3b in the EUV mask Mb. The non-polarized BS 20b transmits a part of the reflected light R2b, which is collected by the objective lens 40 and includes the S-polarized beam and the P-polarized beam.

The objective lens 40 collects the illumination light L3a and L3b reflected in the beam splitter unit 20 in the mask to be inspected. At the same time, the objective lens 40 collects the reflected light R1a and R1b obtained by reflecting the illumination light L3a and L3b in the mask to be inspected.

The mirror 50 reflects the reflected light R2a and R2b that have been collected in the objective lens 40 and have been transmitted through the beam splitter unit 20 for the polarization splitting unit 60.

The polarization splitting unit 60 is collected in the objective lens 40, and splits the reflected light R2 that has been transmitted through the beam splitter unit 20. The polarization splitting unit 60 includes a space splitting mirror 61. The space splitting mirror 61 is arranged, for example, to reflect the P-polarized beam in the reflected light R2. In the case in which the EUV mask Mb is inspected, the space splitting mirror 61 is arranged in such a way that it reflects the P-polarized beam that is positioned on the −Z-axis side of the reflected light R2b.

The part of the reflected light R2 on the +Z-axis direction side is not made incident on the space splitting mirror 61 and passes through the space splitting mirror 61. In the case in which the optical mask Ma is inspected, for example, the P-polarized beam that is positioned on the +Z-axis direction side of the reflected light R2a passes through the space splitting mirror 61. Further, in the case in which the EUV mask Mb is inspected, the S-polarized beam that is positioned on the +Z-axis direction side of the reflected light R2b is not made incident on the space splitting mirror 61 and passes through the space splitting mirror 61.

The reflected light R2 reflected in the space splitting mirror 61 is made incident on the detector 71. The reflected light R2 that has not been reflected in the space splitting mirror 61 and has passed through the space splitting mirror 61 is made incident on the detector 72. The detectors 71 and 72 are, for example, TDI sensors.

As described above, the polarization splitting unit 60 guides the reflected light R2 collected by the objective lens 40 to the detectors 71 and 72. The detector 71 detects the reflected light R2 including one of the P-polarized light and S-polarized light beams that have been transmitted through the beam splitter unit 20, the P-polarized light and S-polarized light beams having been collected in the objective lens 40. The detector 72 detects the reflected light R2 including the other one of the P-polarized light and the S-polarized beam.

The mask inspection apparatus 1 inspects the mask to be inspected based on the reflected light R2 detected by the detectors 71 and 72. The mask inspection apparatus 1 includes, for example, a processor (not shown) such as a Personal Computer (PC), and inspects the target to be inspected from the image processed using the reflected light beams detected by the respective detectors.

Switching Method

Next, a mask inspection method for inspecting the mask to be inspected using the mask inspection apparatus 1 will be explained. First, a switching method of the mask inspection apparatus 1 between a case in which the optical mask Ma is inspected and a case in which the EUV mask Mb is inspected will be explained.

Figure 5:
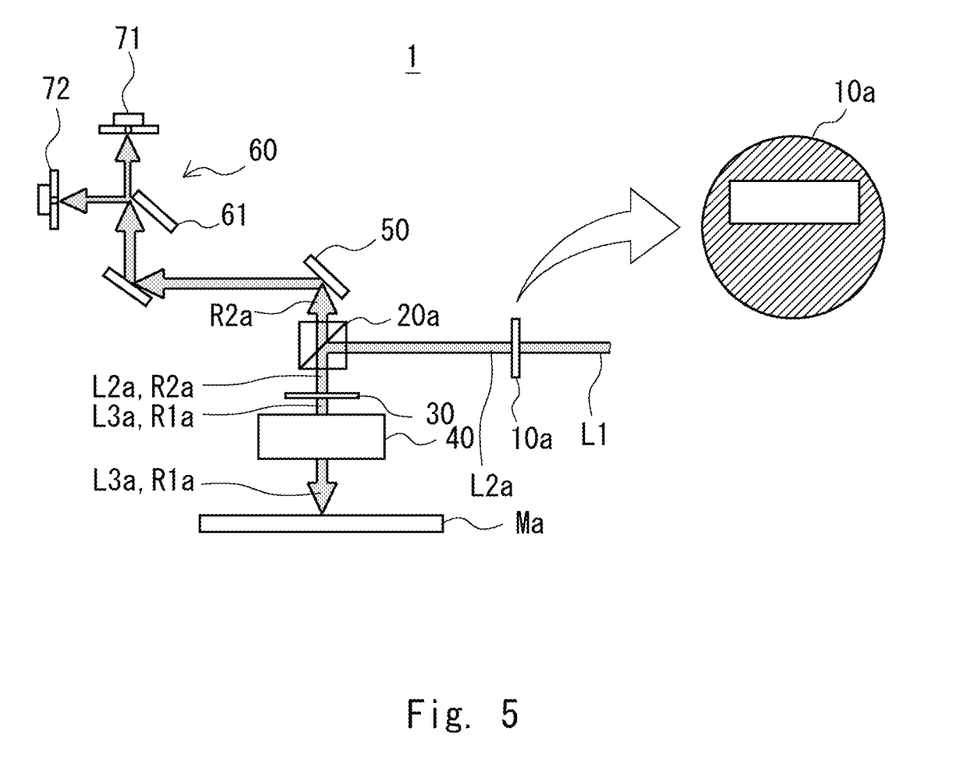
FIG. 5 is a configuration diagram illustrating a switching method of the mask inspection apparatus according to the embodiment.
Figure 6:
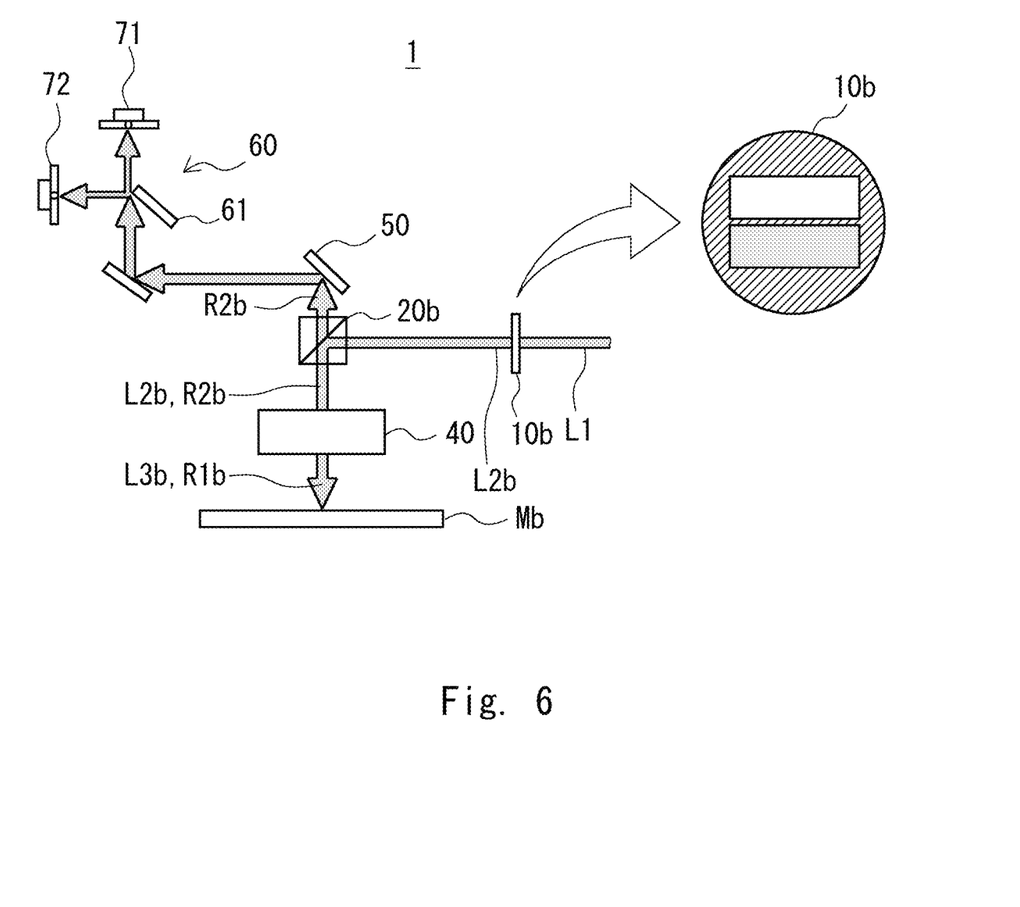
FIG. 6 is a configuration diagram illustrating the switching method of the mask inspection apparatus according to the embodiment.

FIGS. 5 and 6 are configuration diagrams each illustrating the switching method of the mask inspection apparatus according to the embodiment. As shown in FIG. 5, in a case in which the optical mask Ma is inspected, the field stop unit 10 is switched to the field stop for the optical mask 10a. The beam splitter unit 20 is switched to the PBS for the optical mask 20a. The λ/4 plate 30 is provided in the optical path of the illumination light L2a and the reflected light R1a. The illumination light L1 including the S-polarized beam is made incident on the field stop for the optical mask 10a. The field stop for the optical mask 10a causes the incident illumination light L1 including the S-polarized beam to be emitted while maintaining the polarization state thereof. The illumination light L2a that has been emitted from the field stop for the optical mask 10a is made incident on the PBS for the optical mask 20a. The PBS for the optical mask 20a reflects the incident illumination light L2a including the S-polarized beam. The direction of the illumination light L2a that has been reflected in the PBS for the optical mask 20a is changed toward the optical mask Ma, and is then made incident on the λ/4 plate 30.

The λ/4 plate 30 converts the incident illumination light L2a including the S-polarized beam into the illumination light L3a including the circularly polarized light when it causes the illumination light L2a to be transmitted. The illumination light L3a including the circularly polarized light beams that have been transmitted through the λ/4 plate 30 is collected in the inspection area of the optical mask Ma by the objective lens 40. The reflected light R1a obtained by reflecting the illumination light L3a in the optical mask Ma includes the circularly polarized light beams that have been rotated in the direction opposite to that of the illumination light L3a. The reflected light R1a reflected in the optical mask Ma is collected by the objective lens 40 and is then made incident on the λ/4 plate 30. The λ/4 plate 30 converts the incident reflected light R1a including the circularly polarized light beams into the reflected light R2a including the P-polarized beam when it causes the reflected light R1a to be transmitted. The reflected light R2a including the P-polarized light that has been transmitted through the λ/4 plate 30 is made incident on the PBS for the optical mask 20a.

The PBS for the optical mask 20a causes the incident reflected light R2a including the P-polarized beam to be transmitted. The direction of the reflected light R2a that has been transmitted through the PBS for the optical mask 20a is changed in the mirror 50, and is then made incident on the polarization splitting unit 60. The space splitting mirror 61 of the polarization splitting unit 60 reflects the incident reflected light R2a including the P-polarized beam in such a way that the reflected light R2a is made incident on, for example, the detector 72. The reflected light R2a that has not been made incident on the space splitting mirror 61 and has passed through the space splitting mirror 61 is detected by the detector 71. Note that the reflected light R2a including the P-polarized beam may be detected by the detector 71.

On the other hand, as shown in FIG. 6, in a case in which the EUV mask Mb is inspected, the field stop unit 10 is switched to the field stop for the EUV mask 10b. The beam splitter unit 20 is switched to the non-polarized BS 20b. The λ/4 plate 30 is removed from the optical path of the illumination light L2b and the reflected light R2b.

The illumination light L1 including the S-polarized beam is made incident on the field stop for the EUV mask 10b. The field stop for the EUV mask 10b changes the polarization state of a part of the incident illumination light L1 including the S-polarized beam and emits the illumination light L2b including the S-polarized light and P-polarized light beams. The illumination light L2b emitted from the field stop for the EUV mask 10b is made incident on the non-polarized BS 20b. The non-polarized BS 20b reflects a part of the incident illumination light L2b including the S-polarized light and P-polarized light beams. The direction of the illumination light L2b reflected in the non-polarized BS 20b is changed toward the optical mask Ma, and is collected in the inspection area of the EUV mask Mb by the objective lens 40. The illumination light L3b collected by the objective lens 40 illuminates the EUV mask Mb. The reflected light R1b obtained by reflecting the illumination light L3b in the EUV mask Mb includes the S-polarized light and P-polarized light beams. The reflected light R1b reflected in the EUV mask Mb is collected by the objective lens 40. The reflected light R2b collected by the objective lens 40 is made incident on the non-polarized BS 20b.

The non-polarized BS 20b causes a part of the incident reflected light R2b including the S-polarized light and P-polarized light beams to be transmitted. The direction of the reflected light R2b that has been transmitted through the non-polarized BS 20b is changed in the mirror 50, and is then made incident on the polarization splitting unit 60. The polarization splitting unit 60 reflects the incident reflected light R2b including the P-polarized beam in such a way that the reflected light R2b is made incident on, for example, the detector 72. The reflected light R2b including the S-polarized beam that is not made incident on the space splitting mirror 61 and has passed through the space splitting mirror 61 is detected by the detector 71. Note that the reflected light R2b including the S-polarized beam may be detected by the detector 72 and the reflected light R2b including the P-polarized beam may be detected by the detector 71.

Mask Inspection Method

Next, a mask inspection method for inspecting the mask to be inspected using the mask inspection apparatus 1 will be explained. The mask inspection method according to this embodiment is an inspection method that uses the field stop unit 10 and the beam splitter unit 20. Then, by the aforementioned switching method, a case in which the optical mask Ma is inspected and a case in which the EUV mask Mb is inspected are switched, whereby the mask to be inspected is inspected.

Figure 7:
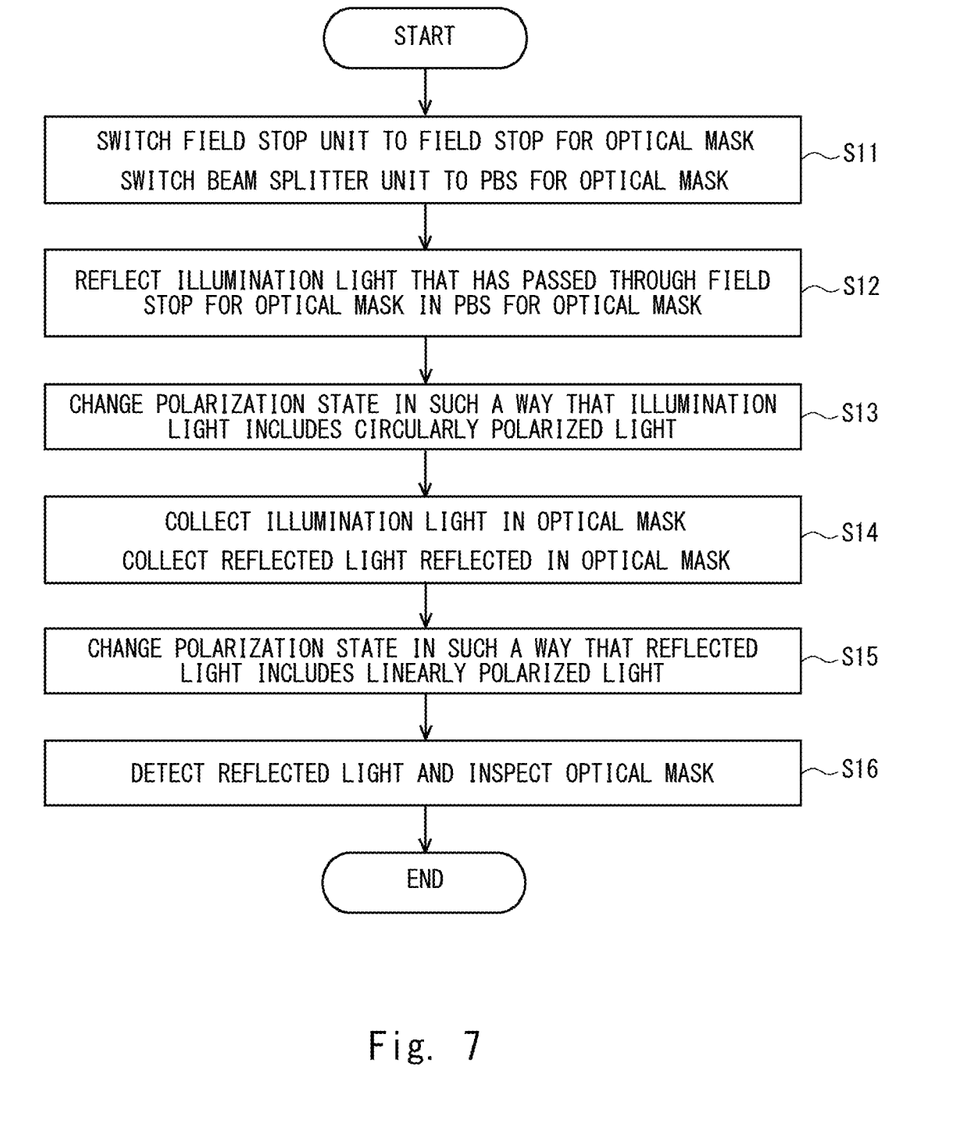
FIG. 7 is a flowchart illustrating a case in which an optical mask is inspected in the mask inspection method according to this embodiment.
Figure 8:
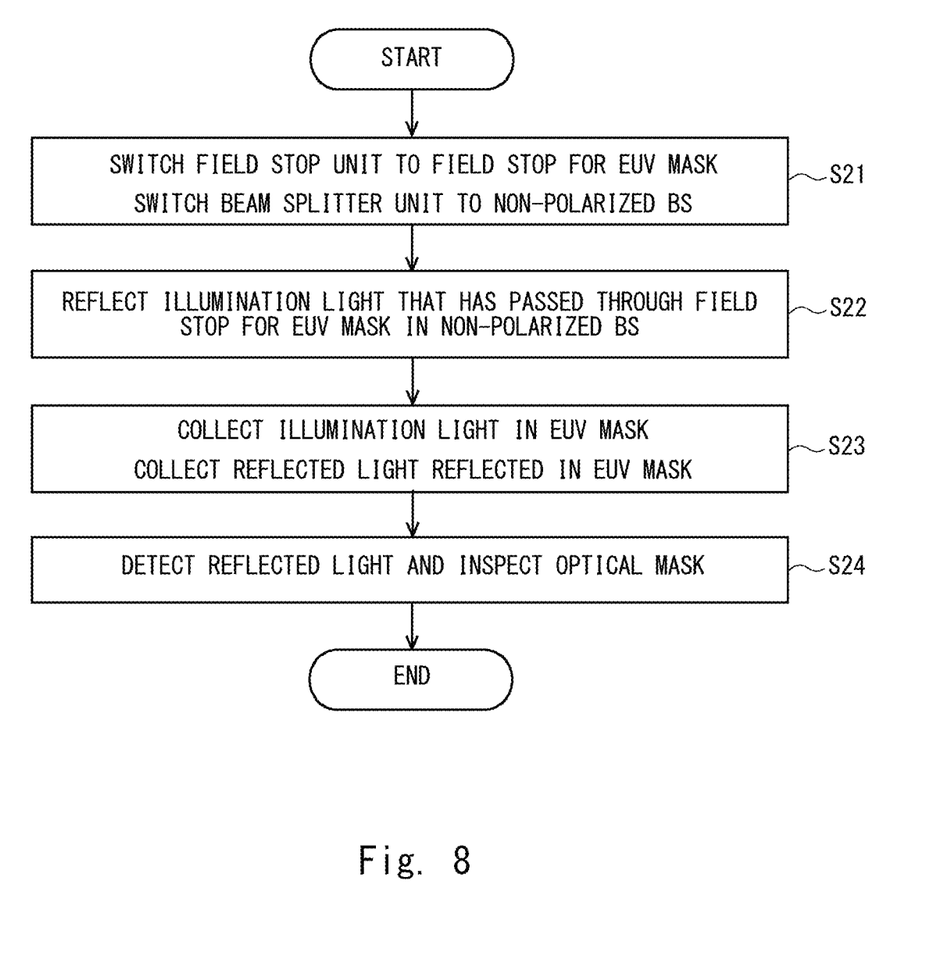
FIG. 8 is a flowchart illustrating a case in which an EUV mask is inspected in the mask inspection method according to this embodiment.

FIG. 7 is a flowchart illustrating a case in which the optical mask is inspected in the mask inspection method according to this embodiment, and FIG. 8 is a flowchart illustrating a case in which the EUV mask is inspected in the mask inspection method according to this embodiment.

As shown in Step S11 in FIG. 7, when the optical mask Ma is inspected, the field stop unit 10 is switched to the field stop for the optical mask 10a and the beam splitter unit 20 is switched to the PBS for the optical mask 20a.

Next, as shown in Step S12, the illumination light L2a that has passed through the field stop for the optical mask 10a is reflected in the PBS for the optical mask 20a.

Next, as shown in Step S13, the polarization state of the illumination light L2a is changed in such a way that the illumination light L2a reflected in the PBS for the optical mask 20a includes circularly polarized light beams. Specifically, the illumination light L2a is caused to be transmitted through the λ/4 plate 30, whereby the illumination light L2a is converted into the illumination light L3a including the circularly polarized light beams.

Next, as shown in Step S14, the illumination light L3a including the circularly polarized light is collected in the optical mask Ma, and collects the reflected light R1a obtained by reflecting the illumination light L3a in the optical mask Ma. Specifically, the illumination light L3a is collected in the optical mask Ma and the reflected light R1a is collected by the objective lens 40.

Next, as shown in Step S15, the polarization state is changed in such a way that the reflected light R1a includes the P-polarized beam. Specifically, the reflected light R1a is caused to be transmitted through the λ/4 plate 30, whereby the reflected light R1a is converted into the reflected light R2a including the P-polarized light.

Next, as shown in Step S16, the reflected light R2a including the P-polarized light is detected. Then the image of the pattern surface of the optical mask Ma is acquired based on the reflected light R2a detected by the detector 71 or 72. In this way, the optical mask Ma can be inspected.

On the other hand, as shown in Step S21 in FIG. 8, when the EUV mask Mb is inspected, the field stop unit 10 is switched to the field stop for the EUV mask 10b and the beam splitter unit 20 is switched to the non-polarized BS 20b.

Next, as shown in Step S22, the illumination light L2b that has passed through the field stop for the EUV mask 10b is reflected in the non-polarized BS 20b.

Next, as shown in Step S23, the illumination light L3b reflected in the non-polarized BS 20b is collected in the EUV mask Mb, and collects the reflected light R1b obtained by reflecting the illumination light L3b in the EUV mask Mb. Specifically, the illumination light L3b is collected in the EUV mask Mb and the reflected light R1b is collected by the objective lens 40.

Next, as shown in Step S24, the reflected light including the S-polarized beam and the reflected light R2b including the P-polarized beam are detected. Then an image of the pattern surface of the EUV mask Mb is acquired based on the reflected light R2b detected by the detector 71 and the reflected light R2b detected by the detector 72. In this way, the EUV mask Mb can be inspected.

Next, effects of this embodiment will be explained. The mask inspection apparatus 1 according to this embodiment is able to switch the field stop unit 10 and the beam splitter unit 20 depending on the mask to be inspected. Therefore, it is possible to inspect the optical mask Ma and the EUV mask Mb and to improve the accuracy of the inspection.

Further, the non-polarized BS 20b is the one that includes a metal film, not a half mirror having a flat plate shape. It is therefore possible to eliminate the influence of the refraction in the interface of the half mirror and to prevent the optical axis from being deviated.

The field stop for the EUV mask 10b includes a λ/2 plate 14. Therefore, the illumination light L2b that has been emitted from the field stop for the EUV mask 10b includes an S-polarized light and a P-polarized light, and is able to accurately detect the fine patterns that are extended in the vertical direction and the horizontal direction on the pattern surface of the EUV mask Mb.

The mask inspection method using the mask inspection apparatus 1 is able to inspect both the optical mask Ma and the EUV mask Mb by one apparatus. It is therefore possible to reduce the inspection cost and the inspection time.

MODIFIED EXAMPLE

Figure 9:
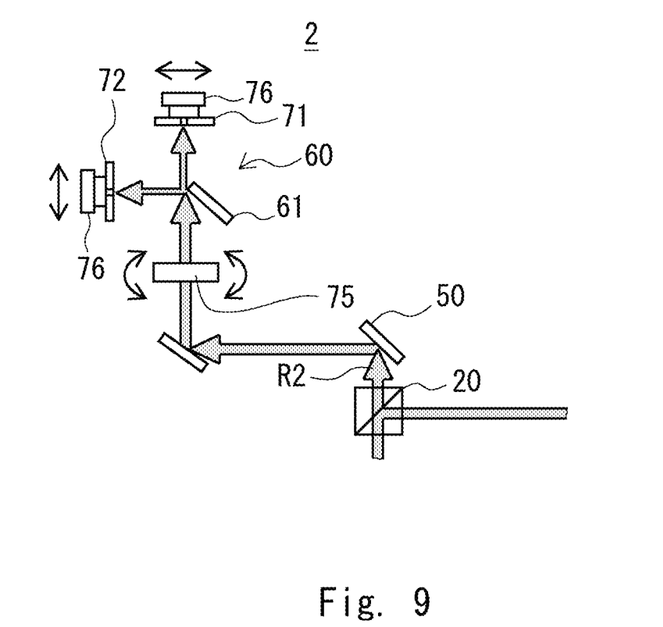
FIG. 9 is a configuration diagram illustrating a part near a polarization splitting unit of a mask inspection apparatus according to a modified example of the embodiment.

Next, a mask inspection apparatus according to a modified example of the embodiment will be explained. FIG. 9 is a configuration diagram illustrating a part near a polarization splitting unit of the mask inspection apparatus according to the modified example of the embodiment. As shown in FIG. 9, a mask inspection apparatus 2 according to the modified example further includes a positioner 75 and a stage 76. The positioner 75 adjusts the optical axis of the reflected light R2 that has been transmitted through the beam splitter unit 20. Specifically, the positioner 75 is provided in the optical path of the reflected light R2 which is between the mirror 50 and the polarization splitting unit 60. The positioner 75 detects the deviation of the optical axis of the incident reflected light R2. Then the positioner 75 adjusts the optical axis of the reflected light R2 in such a way that the reflected light R2 travels through a predetermined optical path.

The stage 76 adjusts the positions of the detector 71 and the detector 72. Specifically, the stage 76 is attached to the detector 71 and the detector 72. The stage 76 adjusts the positions of the detector 71 and the detector 72 in such a way that the detector 71 and the detector 72 are arranged in predetermined positions.

Since the mask inspection apparatus 2 includes the positioner 75 and the stage 76, even when the optical axis is deviated, the deviated optical axis can be corrected. It is therefore possible to improve the accuracy of the inspection. The other configurations and effects are included in the descriptions of the embodiment.

While the embodiment and the modified example of the present disclosure have been described above, the present disclosure includes appropriate modifications as long as they do not impair objects and advantages thereof. Further, the present disclosure is not limited to the abovementioned embodiment and modified example. Furthermore, the configurations of the embodiment and the modified example may be combined with each other as appropriate.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

The invention claimed is:

1. A mask inspection apparatus comprising:
a field stop unit capable of switching between a field stop for an optical mask configured to emit an incident illumination light including a first linearly polarized light while maintaining the polarization state of the illumination light and a field stop for an EUV mask configured to change the polarization state of a part of the incident illumination light including the first linearly polarized light and to cause the illumination light including the first linearly polarized light and a second linearly polarized light whose polarization direction is different from that of the first linearly polarized light to be emitted;
a beam splitter unit capable of switching between a PBS for an optical mask configured to reflect light including the first linearly polarized light and transmit light including the second linearly polarized light and a non-polarized BS configured to reflect a part of light including the first linearly polarized light and the second linearly polarized light and transmit the part of light including the first linearly polarized light and the second linearly polarized light;
an objective lens configured to collect the illumination light reflected in the beam splitter unit in a mask to be inspected and collect reflected light obtained by reflecting the illumination light in the mask to be inspected;
a $\lambda/4$ plate that is provided in an optical path of the illumination light and the reflected light when the optical mask is inspected and that is removed from the optical path of the illumination light and the reflected light when the EUV mask is inspected; and
a first detector configured to detect the reflected light including one of the first linearly polarized light and the second linearly polarized light that have been collected by the objective lens and have been transmitted through the beam splitter unit and a second detector configured to detect the reflected light including the other one of the first linearly polarized light and the second linearly polarized light.

2. The mask inspection apparatus according to claim 1, wherein the non-polarized BS comprises a metal film.

3. The mask inspection apparatus according to claim 1, wherein
the field stop for the EUV mask includes a $\lambda/2$ plate, and
the illumination light that has been emitted from the field stop for the EUV mask includes a part that has been transmitted through the $\lambda/2$ plate.

4. The mask inspection apparatus according to claim 1, further comprising:
a positioner configured to adjust an optical axis of the reflected light that has been transmitted through the beam splitter unit; and
a stage configured to adjust positions of the first detector and the second detector.

5. A switching method of a mask inspection apparatus comprising:
a field stop unit capable of switching between a field stop for an optical mask configured to emit an incident illumination light including a first linearly polarized light while maintaining the polarization state of the illumination light and a field stop for an EUV mask configured to change the polarization state of a part of the incident illumination light including the first linearly polarized light and to cause the illumination light including the first linearly polarized light and a second linearly polarized light whose polarization direction is different from that of the first linearly polarized light to be emitted;
a beam splitter unit capable of switching between a PBS for an optical mask configured to reflect light including the first linearly polarized light and transmit light including the second linearly polarized light and a non-polarized BS configured to reflect a part of light including the first linearly polarized light and the second linearly polarized light and transmit the part of light including the first linearly polarized light and the second linearly polarized light;
an objective lens configured to collect the illumination light reflected in the beam splitter unit in a mask to be inspected and collect reflected light obtained by reflecting the illumination light in the mask to be inspected;
a $\lambda/4$ plate that is provided in an optical path of the illumination light and the reflected light; and
a first detector configured to detect the reflected light including one of the first linearly polarized light and the second linearly polarized light that have been collected by the objective lens and have been transmitted through the beam splitter unit and a second detector configured to detect the reflected light including the other one of the first linearly polarized light and the second linearly polarized light, wherein
when the optical mask is inspected,
the field stop unit is switched to the field stop for the optical mask,
the beam splitter unit is switched to the PBS for the optical mask, and
the $\lambda/4$ plate is provided in the optical path of the illumination light and the reflected light, and
when the EUV mask is inspected,
the field stop unit is switched to the field stop for the EUV mask,
the beam splitter unit is switched to the non-polarized BS, and
the $\lambda/4$ plate is removed from the optical path of the illumination light and the reflected light.

6. The switching method according to claim 5, wherein the non-polarized BS comprises a metal film.

7. The switching method according to claim 5, wherein
the field stop for the EUV mask includes a $\lambda/2$ plate, and
the illumination light that has been emitted from the field stop for the EUV mask includes a part that has been transmitted through the $\lambda/2$ plate.

8. The switching method according to claim 5, further comprising:
a positioner configured to adjust an optical axis of the reflected light that has been transmitted through the beam splitter unit; and
a stage configured to adjust positions of the first detector and the second detector.

9. A mask inspection method using:
a field stop unit capable of switching between a field stop for an optical mask configured to emit an incident illumination light including a first linearly polarized light while maintaining the polarization state of the illumination light and a field stop for an EUV mask configured to change the polarization state of a part of the incident illumination light including the first linearly polarized light and to cause the illumination light including the first linearly polarized light and a second linearly polarized light whose polarization direction is different from that of the first linearly polarized light to be emitted; and a beam splitter unit capable of switching between a PBS for an optical mask configured to reflect light including the first linearly polarized light and transmit light including the second linearly polarized light and a non-polarized BS configured to reflect a part of light including the first linearly polarized light and the second linearly polarized light and transmit the part of light including the first linearly polarized light and the second linearly polarized light, wherein, when the optical mask is inspected, the method comprises:

a step of switching the field stop unit to the field stop for the optical
mask and switching the beam splitter unit to the PBS for the optical mask;
a step of reflecting the illumination light that has passed through the field stop for the optical mask in the PBS for the optical mask;
a step of changing the polarization state in such a way that the illumination light reflected in the PBS for the optical mask includes a circularly polarized light;
a step of collecting the illumination light including the circularly polarized light in the optical mask and collecting the reflected light obtained by reflecting the illumination light in the optical mask;
a step of changing the polarization state in such a way that the reflected light includes the second linearly polarized light; and
a step of detecting the reflected light including the second linearly polarized light, and when the EUV mask is inspected, the method comprises:

a step of switching the field stop unit to the field stop for the EUV mask and switching the beam splitter unit to the non-polarized BS;
a step of reflecting the illumination light that has passed through the field stop for the EUV mask in the non-polarized BS;
a step of collecting the illumination light reflected in the non-polarized BS in the EUV mask and collecting the reflected light obtained by reflecting the illumination light in the EUV mask; and
a step of detecting the reflected light including the first linearly polarized light and the reflected light including the second linearly polarized light.

10. The mask inspection method according to claim 9, wherein the non-polarized BS comprises a metal film.

11. The mask inspection method according to claim 9, wherein
the field stop for the EUV mask includes a $\lambda/2$ plate, and
the illumination light that has been emitted from the field stop for the EUV mask includes a part that has been transmitted through the $\lambda/2$ plate.

12. The mask inspection method according to claim 9, wherein,
in the step of detecting the reflected light when the optical mask is inspected and in the step of detecting the reflected light when the EUV mask is inspected,
a positioner configured to adjust an optical axis of the reflected light that has been transmitted through the beam splitter unit is used, and
a stage configured to adjust the position of a detector that detects the reflected light is used.

* * * * *